United States Patent [19]

Sugita et al.

[11] Patent Number: 4,528,645
[45] Date of Patent: Jul. 9, 1985

[54] MAGNETIC BUBBLE MEMORY DEVICE

[75] Inventors: Yutaka Sugita, Tokorozawa; Ryo Suzuki, Kodaira; Naoki Kodama; Masatoshi Takeshita, both of Hachioji; Tadashi Ikeda, Kodaira, all of Japan

[73] Assignee: Hitachi, Ltd., Tokyo, Japan

[21] Appl. No.: 375,344

[22] Filed: May 5, 1982

[30] Foreign Application Priority Data

May 11, 1981 [JP] Japan .................................. 56-69444

[51] Int. Cl.³ .............................................. G11C 19/08
[52] U.S. Cl. ........................................ 365/36; 365/12; 365/16
[58] Field of Search .................. 365/36, 15, 16, 12

[56] References Cited

U.S. PATENT DOCUMENTS 4,086,572 4/1978 Bullock ................................. 365/36
4,360,904 11/1982 Gergis ................................... 365/12

OTHER PUBLICATIONS

Electronics-Aug. 2, 1979-pp. 99–108.

Primary Examiner—James W. Moffitt
Attorney, Agent, or Firm—Antonelli, Terry & Wands

[57] ABSTRACT

A magnetic bubble memory device is disclosed in which a magnetic bubble propagation circuit for forming a minor loop is formed by ion implantation, and at least part of a major line or major loop and at least part of connecting portions between the minor loop and the major line or major loop are formed of a film of a soft magnetic material.

13 Claims, 13 Drawing Figures

MAGNETIC BUBBLE MEMORY DEVICE

The present invention relates to a magnetic bubble memory device, and more particularly to a magnetic bubble memory device which can propagate magnetic bubbles having a very small diameter (namely, small magnetic bubbles) without a hitch and is suitable for use in a file memory included in an electronic computer or electronic exchange.

Figure 1:
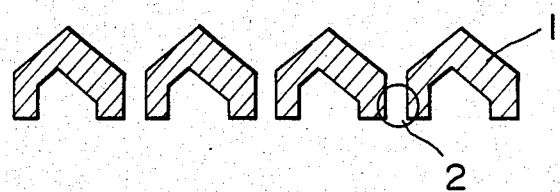
FIG. 1 is a plan view showing an example of a conventional permalloy pattern.

As is well known, a device called the permalloy device has been generally used as a magnetic bubble memory device. This device is characterized in that a permalloy film (namely, a film of a soft magnetic material) 1 having, for example, such a planar shape as shown in FIG. 1 is provided over a magnetic garnet film (not shown) for magnetic bubbles which is made of, for example, $(YSmLuCa)_3 (FeGe)_5O_{12}$ to form a magnetic bubble propagation circuit, and a rotating field is applied parallel to the garnet film to propagate a magnetic bubble 2 along the propagation circuit.

Figure 2:
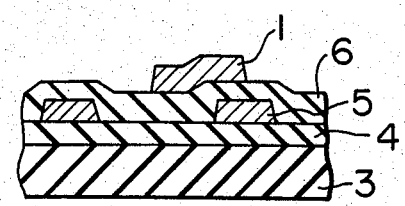
FIG. 2 is a sectional view showing a main part of a permalloy device.

A generator, a transfer gate, a swap gate, a replicator and others for generating, transferring, swapping and replicating magnetic bubbles, and performing other operations, respectively, are made up of such a permalloy pattern (namely, the permalloy film) 1 and a conductor pattern 5 as shown in section in FIG. 2. The conductor pattern 5 is made of, for example, an Al-Cu alloy or gold, and provided between the permalloy pattern 1 and a magnetic garnet film 3 in such a manner that insulating films 4 and 6 are provided between the garnet film 3 and the conductor pattern 5 and between the conductor pattern 5 and the permalloy pattern 1, respectively. By passing a control pulse current through the conductor pattern 5, such functions as the generation and transfer of magnetic bubbles are performed.

The magnetic garnet film 3 for magnetic bubbles is generally formed, by epitaxial growth, on a (111) crystallographic plane of a nonmagnetic monocrystalline substrate made of, for example, $Gd_3Ga_5O_{12}$. Since the nonmagnetic monocrystalline substrate has no immediate connection with the present invention, it is omitted in FIG. 2 to facilitate the understanding.

As the bit density and integration at permalloy devices are made high, the width of the permalloy pattern 1 and the gap length in the permalloy pattern are both made very small. For example, in the case where a bubble device having a bit period of 8 μm is formed with magnetic bubbles about 2 μm in diameter, the width of the permalloy pattern and the gap length are required to be about 1 μm. In order to further increase the bit density at permalloy devices, it is required to precisely form a fine permalloy pattern having a width and a gap smaller than 1 μm, respectively, all over the surface of a chip. Technically, it is very difficult to form such a fine permalloy pattern.

Figure 3:
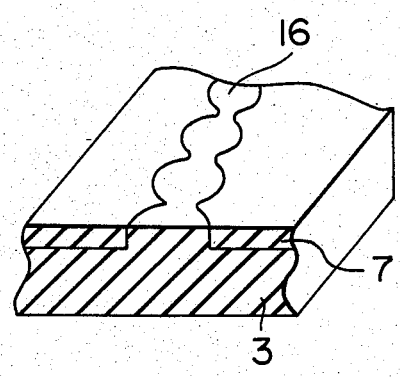
FIG. 3 is a perspective view for explaining a bubble propagation circuit of an ion-implanted device.

On the other hand, a new type of bubble device has recently attracted special attention (refer to U.S. Pat. No. 3,828,329). This device is characterized in that a bubble propagation circuit formed by ion implantation is used in place of the conventional permalloy propagation circuit (namely, the propagation circuit made of a soft magnetic material), and therefore is called the ion-implanted device. In more detail, referring to FIG. 3, a desired portion of a magnetic garnet film 3 is covered with a mask (not shown) having the form of contiguous disks, and ions such as Ne ions or $H_2$ ions are implanted in a surface region of the garnet film 3 to form an ion-implanted layer 7 at a portion of the surface region situated on the outside of the mask so that magnetization in the layer 7 is directed parallel to the film plane. When the garnet film 3 thus ion-implanted is applied with a rotating field in directions parallel to the garnet film, a magnetic bubble is propagated along the edge of a contiguous disk bubble propagation circuit 16, as in the permalloy device. A feature of the ion-implanted device is that dimensions of the contiguous disk bubble propagation circuit 16 may be twice larger than dimensions of the bubble propagation circuit of a permalloy device. Accordingly, the ion-implanted device is easy to fabricate, and is well suited to form a high density magnetic bubble device.

However, the ion-implanted device has drawbacks that the replicator, transfer gate, swap gate and others are not sufficiently stable in operation, and that it is difficult to form a block replicator and therefore the device cannot operate at a high speed. These drawbacks become serious problems when the ion-implanted device is put to practical use.

It is an object of the present invention to provide a high density magnetic bubble memory device which can overcome the above-mentioned drawbacks of the prior art, and which can propagate small magnetic bubbles at a high speed and can perform a stable operation.

It is another object of the present invention to provide a magnetic bubble memory device which is provided with a replicator, a transfer gate, a swap gate and others each capable of performing a sufficiently stable operation, and with a high-density bubble propagation circuit.

In order to attain the above objects, in a magnetic bubble memory device according to the present invention, a bubble propagation circuit for forming a minor loop is formed by ion implantation, and at least part of a major loop (or a major line) and at least part of connecting portions between the minor loop and major loop (or major line) are made of permalloy.

Figure 4:
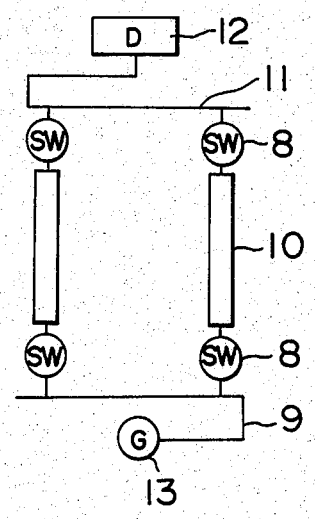
FIG. 4 is a schematic view showing a structure of a magnetic bubble memory device.

As schematically shown in FIG. 4, a magnetic bubble device is generally made up of a plurality of minor loops 10 for storing therein information and a major line or major loop for reading and writing information. Various parts 8 such as a transfer gate, a swap gate and a replicator are used at connecting portions between the minor loops 10 and the major line (or major loop). The minor loops 10 are formed of bubble propagation circuits, and occupy most of the area of the magnetic bubble device. The major line (or major loop) is made up of bubble propagation circuits 9 and 11, a bubble generator 13 and a detector 12. The minor loops 10 are connected to the major line (or major loop) by the parts 8 such as the transfer gate, the swap gate and the replicator. Although only two minor loops are shown in FIG. 4, it is needless to say that the magnetic bubble device is actually provided with a large number of minor loops.

An essential feature of the present invention resides in that each of minor loops occupying a major portion of a device area is a bubble propagation circuit formed by ion implantation and suited for high-density information storage, and at least part of a major line (or major loop), a replicator and a transfer gate is made of a soft magnetic material such as permalloy.

Thus, the replicator, transfer gate and others can perform stable operations though a replicator and others in a conventional ion-implanted device don't perform sufficiently stable operations, and moreover a block replicator can be readily formed.

Further, according to the present invention, the minor loops occupying a major portion of the device area are formed by ion implantation, and therefore a propagation circuit for propagating small magnetic bubbles can be formed more readily than in a conventional permalloy device.

Since the major line, replicator and others occupy a very small portion of the device area, it is easy to form them by patterning a permalloy film finely (or minutely).

Furthermore, it is possible to make the bit period of a major line larger than that of a minor loop portion by a factor of, for example, two to four. By doing so, restrictions on dimensions of the permalloy pattern are relaxed, and therefore the permalloy pattern can be formed more readily.

EMBODIMENT 1

Figure 5:
FIG. 5 is a plan view showing a bubble propagation circuit used in an embodiment of a magnetic bubble memory device according to the present invention.

The present embodiment is an example of a device in which a propagation circuit of a major line, a replicator, a transfer gate, a detector and a bubble generator, that is, all device parts except propagation circuits in minor loops are made of permalloy. That is, a magnetic bubble memory element having a major line-minor loop structure and having bit periods of 4 $\mu$m and 8 $\mu$m at the minor loop and major line, respectively, was fabricated by using a garnet film made of $(YSmLuCa)_3(FeGe)_5O_{12}$ and epitaxially grown on a (111) oriented face of a $Gd_3Ga_5O_{12}$ film so as to have a thickness of about 1 $\mu$m. The garnet film was able to hold magnetic bubbles having a diameter of about 1 $\mu$m. In order to obtain a plurality of minor loops each having the same shape as a propagation circuit 16 shown in FIG. 5 and a minimum width of about 1 $\mu$m, triple ion-implantation was carried out under conditions $Ne^+$ (50 KeV, $2\times 10^{14}/cm^2$), $Ne^+$ (180 KeV, $2\times 10^{14}/cm^2$) and $H_2^+$ (100 KeV, $4\times 10^{16}/cm^2$). Incidentally, for example, the formula $Ne^+$ (50 KeV, $2\times 10^{14}/cm^2$) indicates that Ne ions having an implant energy of 50 KeV are implanted in the garnet film at an ion dose of $2\times 10^{14}/cm^2$. A propagation circuit of the major line, a replicator, a transfer gate, a bubble detector and a bubble generator used in the present embodiment were the same as in a conventional permalloy device, that is, were well-known parts. The transfer gate and replicator were formed by providing a permalloy pattern on the minor loops formed by ion implantation.

In the embodiment thus formed, it was found that magnetic bubbles were propagated wihtout a hitch, and the transfer gate and replicator stably performed respective functions when supplied with pulse currents. Further, since one replicator was provided at every minor loop so that a block replicator was formed, the present embodiment was able to transfer magnetic bubbles more rapidly than a conventional ion-implanted device.

Figure 6:
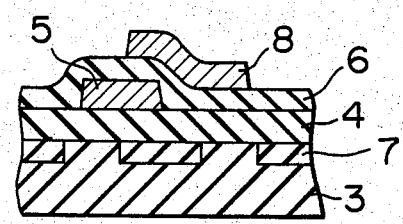
FIG. 6 is a sectional view showing a portion of the above-mentioned embodiment where a replicator is formed.

FIG. 6 is a sectional view showing a portion of the present embodiment where the replicator is provided. Referring to FIG. 6, an ion-implanted layer 7 is formed selectively in a surface region of the magnetic garnet film 3 so as to make the minor loops and a conductor pattern 5 and a permalloy pattern 8 for making up the replicator are formed in such a manner that insulating films 4 and 6 are provided between the garnet film 3 and conductor pattern 5 and between the conductor pattern 5 and permalloy pattern 8, respectively.

It was found that all of parts such as the replicator performed stable operations without a hitch when the present embodiment was applied with a rotating field of more than 40 Oe in the film plane.

Figure 7:
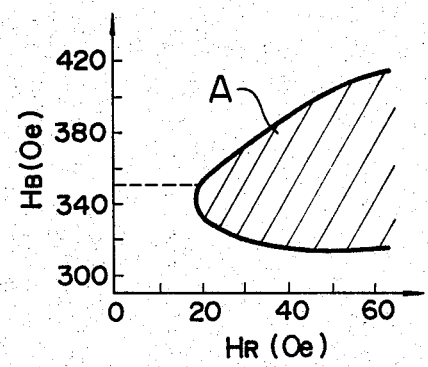
FIG. 7 is a graph for showing an example of the bias margin for propagation at a magnetic bubble memory device according to the present invention.

FIG. 7 shows a relation between a rotating field $H_R$ and a bias field $H_B$ applied in a direction perpendicular to the film plane, and a hatched region A shown in FIG. 7 indicates a stable operation range of the present embodiment. In this case, the frequency of the rotating field $H_R$ applied in the film plane is made equal to 200 KHz. As is apparent from FIG. 7, in a region of the rotating field $H_R$ exceeding 40 Oe, the bias field $H_B$ has on both sides of a center value (indicated by a broken line) a range of more than ten percent of the center value. Accordingly, it is known that a device according to the present invention has a large bias margin for memory operation and therefore is a very excellent device from a practical point of view.

Although the propagation circuit of the major line was formed of the permalloy pattern in the present embodiment, similar results were obtained even when this propagation circuit was formed by ion implantation.

The device structure in the present embodiment is not limited to a device having a bit period of 4 $\mu$m, but is applicable to a device having a bit period of more than or less than 4 $\mu$m.

EMBODIMENT 2

Figure 8:
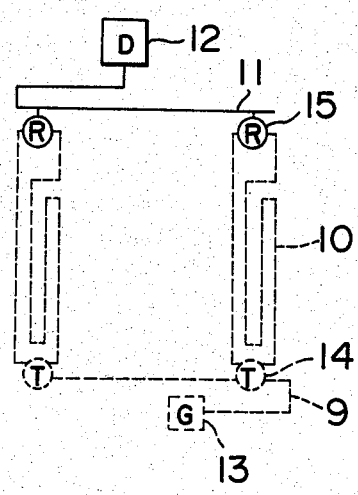
FIGS. 8 and 9 are schematic views showing another and a further embodiment of a magnetic bubble memory device according to the present invention.

FIG. 8 is a schematic view showing the structure of another embodiment of a magnetic bubble memory device according to the present invention. In FIG. 8, a solid line indicates a propagation circuit made of permalloy, and a broken line a propagation circuit formed by ion implantation.

As is apparent from FIG. 8, in the present embodiment, a major portion of each minor loop 10, a magnetic bubble generator 13, a write major line 9 and a transfer gate 14 were formed by ion implantation. On the other hand, the remaining parts, that is, a replicator 15, a portion of each minor loop 10 in close proximity to the replicator 15, a read major line 11 and a detector 12 were formed of a permalloy film.

Thus, in the present embodiment, the propagation circuit formed of the permalloy film was completely separated from the propagation circuits formed by ion implantation, at portions other than connecting portions. Although various transfer gates can be formed by ion implanation, a gate for ion-implanted devices disclosed in an article (IEEE Transactions on Magnetics, Vol. MAG-17, No. 1, pp. 1134 to 1141) was used as the transfer gates 14 in the present embodiment. Further, although various replicators can be formed of a permalloy film, a block replicator disclosed in an article (IEEE Transactions on Magnetics, Vol. MAG-12, No. 6, pp. 614 to 617) was used. A thick film permalloy detector made up of a magnetic bubble expander and a detection line was used as the detector 12. Further, each of the propagation circuits formed by ion implantation had the shape shown in FIG. 5, and the propagation circuit formed of a permalloy film had such a form as shown in FIG. 1. In order to increase a bias margin at the permalloy propagation circuit, the bit period of the permalloy propagation circuit was made twice larger than that of the propagation circuit formed by ion implantation. Further, such a folded loop as shown in FIG. 8 was used as the minor loop. Thus, a chip having the block replicator was rerdily formed, and it was found that the present embodiment exhibited satisfactory characteristics as a magnetic bubble memory device.

Further, although the transfer gate 14 in the present embodiment was formed by ion implantation, it is needless to say that the transfer gate 14 may be replaced by a transfer gate made of a permalloy film. A magnetic bubble memory device obtained in this case can exhibit more excellent characteristics than the present embodiment.

Further, it is a matter of course that a portion of each minor loop in close proximity to the transfer gate 14 and the whole of the major loop (or major line) may be formed of a permalloy film.

EMBODIMENT 3

Figure 9:
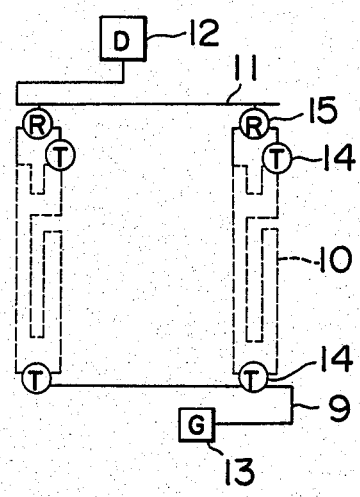

FIG. 9 shows a further embodiment of a magnetic bubble memory device according to the present invention. In FIG. 9, a broken line portion indicates a propagation circuit formed by ion implantation, and a solid line portion a propagation circuit formed of a permalloy film, as in FIG. 8. As is apparent from FIG. 9, in the present embodiment, each of minor loops 10 is given only by a propagation circuit formed by ion implantation, and the lower end of each minor loop 10 is connected through a transfer gate 14 to a write major line 9 which is a permalloy propagation circuit. Further, a by-pass which is formed of a permalloy propagation circuit and includes a replicator 15, is provided at the upper end of each minor loop 10. In the above-mentioned arrangement, a magnetic bubble is propagated on each minor loop 10 counterclockwise. There are two connecting portions between each minor loop 10 and its associated by-pass. A transfer gate 14 is provided at the connecting portion on the right hand side. The connecting portion on the left hand side is a simple merge circuit. Accordingly, a magnetic bubble usually circulates through the minor loop 10 which is formed only by ion implantation. When data are read out, that is, a magnetic bubble is replicated, the transfer gate 14 at the upper end of the minor loop 10 is operated to send the magnetic bubble to the by-pass. When the magnetic bubble reaches the replicator 15, the replicator 15 is operated to perform a replicating operation. Thus, the magnetic bubble is divided into two parts, namely, two magnetic bubbles, one of which is sent to a detector 12 through a read major line 11, and the other returns to the minor loop 10 through the by-pass and merge circuit. Further, the number of bits in the by-pass and the number of bits at an upper portion of the minor loop 10 are selected so that a bit position of the minor loop which is made empty by transferring the magnetic bubble to the by-pass, is again occupied by the magnetic bubble from the replicator 15. In the present embodiment having such a structure, magnetic bubbles are usually propagated along the propagation circuit formed by ion implantation, and only necessary ones of them are transferred to the by-pass formed of the permalloy film when required, to be sent to the detector.

Figure 10:
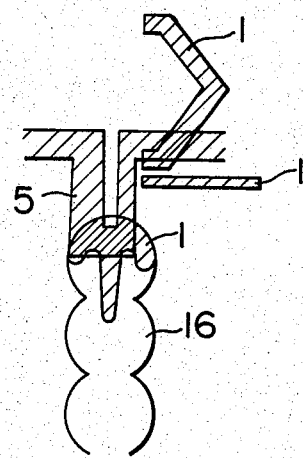
FIGS. 10, 11 and 13 are views showing different examples of the structure of a connecting portion between a major line and a minor loop.

FIG. 10 shows an arrangement at a connecting portion between the read major line 11 and minor loop 10 in a magnetic bubble memory device having the structure shown in FIG. 8. As shown in FIG. 10, a hair-pin shaped conductor pattern 5 for dividing a magnetic bubble into two parts and a pickax permalloy pattern 1 for expanding the magnetic bubble overlap each other with an insulating film therebetween, and the pickax permalloy pattern 1 are formed through another insulating film on an upper portion of a propagation circuit 16 for forming the minor loop 10.

Figure 11:
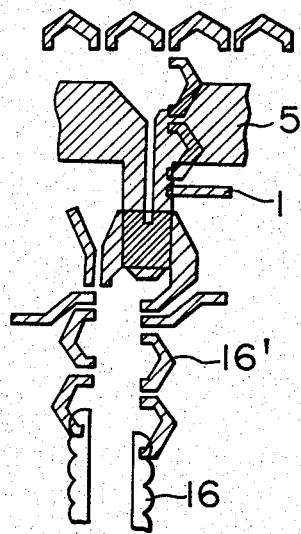

FIG. 10 shows the case where the whole of the propagation circuit 16 for forming the minor loop is formed by ion implantation. However only a portion 16' of the propagation circuit 16 which is in close proximity to the connecting portion between the propagation circuit 16 and read major line, may be formed of a permalloy film, as shown in FIG. 11.

A conventional ion-impanted device is not provided with a member corresponding to a block replicator in a permalloy device. This mainly prevents the high-speed operation of the ion-implanted device. By using the structures shown in FIGS. 10 and 11, a block replicator which performs a sufficiently stable operation, can be formed in an ion-implanted device. It is needless to say that the pickax permalloy pattern may be replaced by permalloy patterns having shapes other than the pickax.

Figure 12:
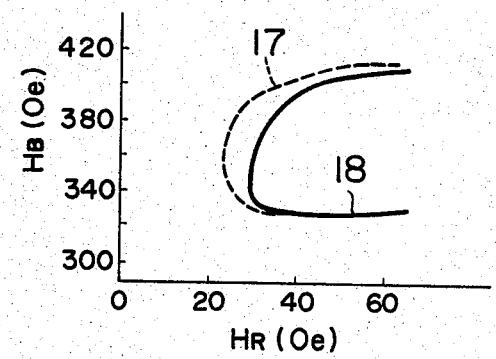
FIG. 12 is a graph for showing an example of the effect of the present invention.

FIG. 12 shows transfer margins at ion-implanted devices. In the case where the above-mentioned permalloy pattern 1 is absent in an ion-implanted device, the device has a transfer margin indicated by a broken line 17 in FIG. 12. In this case, as a matter of course, a magnetic bubble is not replicated.

In the case where an ion-implanted device similar to the above-mentioned is provided with the permalloy pattern 1 in accordance with the present invention, the device has a transfer margin indicated by a solid line 18 in FIG. 12. That is, a reduction in transfer margin is very small. In this case, it has been observed that a magnetic bubble is replicated without a hitch.

Figure 13:
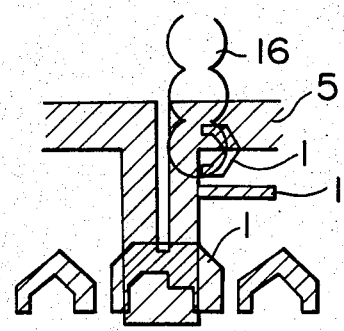

FIG. 13 shows an arrangement at a connecting portion between the write major line 9 and minor loop 10 in a magnetic bubble memory device having the structure shown in FIG. 9. As shown in FIG. 13, a hair-pin shaped conductor pattern 5 is formed through an insulating film on an end portion of a propagation circuit 16 for forming the minor loop 10, and a chevron permalloy pattern 1 is formed on the conductor pattern 5 through another insulating film.

In a conventional ion-implanted device, a write major line is formed only by ion implantation. However, in the embodiment shown in FIGS. 9 and 13, the write major line 9 is formed of the chevron permalloy pattern 1. Accordingly, a magnetic bubble is transferred from the write major line to the minor loop in a very stable manner, and thus one effect of the present invention can be confirmed.

In the present invention, various, well-known magnetic garnet films for a magnetic bubble device, for example, a film of $(YSmLuCa)_3(FeGe)_5O_{12}$ can be used as a magnetic film for magnetic bubbles. These magnetic garnet films are formed usually on a (111) oriented face of a nonmagnetic monocrystalline substrate made of, for example, $Gd_3Ga_5O_{12}$ through the well-known liquid phase epitaxial growth technique. However, these garnet films may be grown on crystallographic planes other than the (111) plane of the above substrate.

It is preferable to make the thickness of a magnetic garnet film for magnetic bubbles nearly equal to the diameter of the magnetic bubbles.

Further, it is preferable that a film made of a soft magnetic material, for example, a permalloy film (namely, an Fe-Ni alloy film) has a thickness of about 0.3 to 0.4 $\mu$m. However, a permalloy film having a thickness of 0.03 to 0.05 $\mu$m can also be used to form a magnetic bubble detector.

Various ions can be implanted in a magnetic garnet film to form a bubble propagation circuit. However, when hydrogen ions are used, extremely favorable results are obtained. Although only hydrogen ions may be implanted in a magnetic garnet film, it is desirable from a practical point of view to further implant other ions such as $Ne^+$ ions having an energy different from that of the hydrogen ions in the magnetic garnet film, as in EMBODIMENT 1, since a strain layer having a uniform distribution of strain in the direction of depth is formed in the magnetic garnet film. Further, it is desirable that a depth to which the above ions are implanted, (namely, the thickness of the strain layer) is about one-fourth to a half of the thickness of the magnetic garnet film.

As is evident from the foregoing explanation, according to the present invention, a very excellent high-density magnetic bubble memory device can be formed which has a very small bit period (for example, about 4 $\mu$m or less), includes a block replicator, and performs a stable operation.

In the foregoing explanation, only a magnetic garnet film has been used as a magnetic film for magnetic bubbles to facilitate the understanding. In the present invention, however, the magnetic film for magnetic bubbles is not limited to the magnetic garnet film, but an amorphous rare earth transition metal film made of, for example, Gd-Co, Gd-Fe, or Gd-Co-Mo, an iron oxide film made of, for example, hexagonal ferrite, and other films can be used as the magnetic film for magnetic bubbles.

What is claimed is:

1. A magnetic bubble memory device comprising:
a magnetic bubble propagation circuit for forming a minor loop, said magnetic bubble propagation circuit being formed by implanting ions in a desired portion of a magnetic film for magnetic bubbles; and
a major line or a major loop, at least part of said major line or major loop being formed of a film of a soft magnetic material, at least part of connecting portions between said minor loop and said major line or major loop being formed of said film of said soft magnetic material.

2. A magnetic bubble memory device according to claim 1, wherein said major line or major loop, a replicator, a transfer gate, a detector and a magnetic bubble generator are formed of said film of said soft magnetic material.

3. A magnetic bubble memory device according to claim 2, wherein said soft magnetic material is permalloy.

4. A magnetic bubble memory device comprising:
a minor loop for storing therein information,
a major line or loop for reading or writing information, and
a connecting portion between said minor loop and said major line or loop, a portion of said minor loop and said major line or loop in close proximity to said connecting portion being formed of a film of a soft magnetic material, said connecting portion being formed of a film of a soft magnetic material, and the remaining portion of said minor loop being formed by implanting ions.

5. A magnetic bubble memory device according to claim 4, wherein said major line or loop is formed of a film of a soft magnetic material.

6. A magnetic bubble memory device according to claim 4 or 5, wherein said major line or loop includes a bubble propagation circuit, a bubble generator and a detector.

7. A magnetic bubble memory device according to claim 4 or 5, wherein said connecting portion is one of a transfer gate, a swap gate and a replicator.

8. A magnetic bubble memory device according to claim 4 or 5, wherein said soft magnetic material is permalloy.

9. A magnetic bubble memory device comprising:
a minor loop for storing therein information,
a write major line or loop for writing information,
a read major line or loop for reading information,
a first connecting portion between said minor loop and said write major line or loop, and
a second connecting portion between said minor loop and said read major line or loop, a portion of said minor loop and said write major line or loop in close proximity to said first connecting portion being formed of a film of a soft magnetic material, a portion of said minor loop and said read major line or loop in close proximity to said second connecting portion being formed of a film of a soft magnetic material, said first and second connecting portions being formed of a film of a soft magnetic material, and the remaining portion of said minor loop being formed by implanting ions.

10. A magnetic bubble device according to claim 9, wherein said write and read major lines or loops are formed of a soft magnetic material.

11. A magnetic bubble memory device according to claim 9 or 10, wherein said write and read major lines or loops include a bubble propagation circuit, a bubble generator and a detector.

12. A magnetic bubble memory device according to claim 9 or 10, wherein each of said first and second connecting portions is one of a transfer gate, a swap gate and a replicator.

13. A magnetic bubble memory device according to claim 9 or 10, wherein said soft magnetic material is permalloy.

* * * * *